(12) United States Patent
Wilson

(10) Patent No.: US 7,268,631 B2
(45) Date of Patent: Sep. 11, 2007

(54) PHASE LOCKED LOOP WITH SCALED DAMPING CAPACITOR

(75) Inventor: William B. Wilson, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 45 days.

(21) Appl. No.: 11/195,267

(22) Filed: Aug. 2, 2005

(65) Prior Publication Data

US 2007/0030078 A1    Feb. 8, 2007

(51) Int. Cl.
*H03L 7/00*   (2006.01)
(52) U.S. Cl. .......................... 331/16; 331/17; 331/175; 327/156
(58) Field of Classification Search ................. 331/16, 331/17, 175, 34, 177 R; 327/156
See application file for complete search history.

(56) References Cited

U.S. PATENT DOCUMENTS 5,495,512 A * 2/1996 Kovacs et al. .............. 375/376
7,026,879 B2   4/2006 Booth ......................... 331/17

* cited by examiner

*Primary Examiner*—Arnold Kinkead

(57) ABSTRACT

In order to reduce the area of a charge pump PLL, one may separate proportional component and integral component of the loop filter voltage, and add additional circuitry so as to make the integral component appear as though it is affected by a much larger value of capacitance than is actually used. In an aspect, a current mirror may be used to subtract a portion of the integral component of the loop filter voltage from the total loop filter voltage. The difference signal is then used to drive an oscillator in the charge pump PLL. In another aspect, a third integrator or auto-calibration loop is used to set a center frequency of the oscillator.

19 Claims, 4 Drawing Sheets

PHASE LOCKED LOOP WITH SCALED DAMPING CAPACITOR

TECHNICAL FIELD

This invention is related in general to phase/delay locked loop circuits, and in particular, to a charge pump phase locked loop circuit with a scaling factor.

BACKGROUND

Because of critical timing requirements in electronic circuits such as communication systems, clock recovery circuits, frequency multipliers, and data synchronization circuits, locally generated clock signals must be accurately synchronized with a reference waveform. A Phase-Locked Loop (PLL) is a feedback control system that adjusts the phase or frequency of a locally generated signal to match the phase and frequency of an input "reference" signal within a period called "lock time." In general, a PLL is used to take a low-frequency off-chip clock and generate a high frequency on-chip clock. A Delay Locked Loop (DLL) is similar to a PLL in that a DLL is designed to generate an output signal at a prescribed delay with respect to an input reference signal.

Typically, a PLL has three components: a phase/frequency detector (PFD), a loop filter (LF), and a controlled oscillator (CO). The CO could be voltage-controlled (VCO) or current-controlled (ICO). The output of the CO is fed back to the PFD. The frequency of the output signal is usually a multiple of the input reference frequency. In addition to the three components stated above, a PLL may also include a charge pump (CP), which manipulates the amount of charge on the filter's capacitors depending on the signals of the PFD. In other words, the PFD produces a signal, which increases or decreases charge output by the CP, which adds or removes charge from the LF capacitor. The CO produces an output clock with a frequency proportional to the voltage or current input to the CO.

PFD/CP converts phase (or frequency) error into current and enables locking output frequency to input frequency. The LF operates on the PFD/CP output current to generate a voltage, which controls the frequency output at the CO. The CO output is fed through programmable dividers then back to the PFD. Because of its feedback nature, the PLL drives the CO until the error at the PFD is zero.

A loop filter may include a resistor and two capacitors—a damping capacitor and a parasitic bypass capacitor. As magnitude of the damping capacitor increases, the area of the integrated circuit increases. It is desirable to increase the effective damping capacitor magnitude without increasing the area. Because the capacitors take up the bulk of the area in a PLL, one may reduce the area of a charge-pump PLL by reducing the area of the damping capacitor $C_1$, and the area of the capacitor associated with auto-calibration loop. One way to reduce the capacitor size is to reduce the gate oxide of the device used to make the integrated capacitors, which allows for a much smaller area for a desired capacitance. But thinner gate oxides lead to gate leakage currents, which in turn cause static phase offset. A technique to alleviate static phase offset is described in U.S. Pat. No. 6,043,715, but this method increases the area, thereby negating the goal of reducing the area. A second method is to use a smaller capacitance value, thereby obtaining a smaller area, but this may cause changes in loop dynamics of the PLL, affecting its closed-loop performance adversely. A third method uses two charge pumps, one for proportional component and one for integral component of loop filter voltage. But the area of the second charge pump and the circuitry required to sum the two separate capacitor voltages counteracts any savings obtained by reducing the size of the capacitor. As we have seen, none of the known methods achieves the goal of reducing the area of a charge pump PLL without undesirable results. Accordingly, there is a need for an improvement in the art.

SUMMARY

In order to reduce the area of a charge pump PLL, one may reduce the area of the capacitor(s) used to implement the loop filter without otherwise affecting loop dynamics and stability of the feedback loop. One can achieve this in a charge pump PLL by separating a proportional component and an integral component of the loop filter voltage, and adding additional circuitry so as to make the integral component appear as though it is affected by a much larger value of capacitance than is actually used. In an aspect, a current mirror may be used to subtract a portion of the integral component of the loop filter voltage from the total loop filter voltage. The difference signal is then used to drive an oscillator in the charge pump PLL. In another aspect, a third integrator or auto-calibration loop is used to set a center frequency of the oscillator.

BRIEF DESCRIPTION OF THE DRAWINGS

These and other features, objects and advantages of the present disclosure may be more readily understood from the following detailed description with reference to the accompanying drawings, where like numbers denote like parts, and wherein.

DETAILED DESCRIPTION

The discussion below uses the following notation:

R denotes an external loop filter resistor, also known as "zero resistor."

$C_1$ denotes one of two capacitors in the external loop filter, sometimes called the "damping capacitor". It is connected in series with R between two device pins, or a device pin and ground.

$C_2$ denotes a second capacitor in the external loop filter, sometimes called "ripple bypass capacitor". It is connected in parallel to series circuit of R and $C_1$. $C_1$ is always larger than $C_2$, typically by a factor of 100.

$I_P$ denotes charge pump current provided by the device, and is sometimes adjustable by a user.

θ denotes the phase of a voltage signal.

$θ_e$ is the phase error output by phase detector.

α denotes the mirroring parameter of a current mirror used in this application.

s denotes Laplace Transform variable.

$K_{VCO}$ denotes small-signal gain of Voltage-Controlled Crystal Oscillator (VCXO) or Voltage-controlled Oscillator (VCO)

F denotes frequency of a signal.

V denotes the voltage of a signal.

M and N denote divide ratios of optional input, output or feedback dividers that may be placed in the input and feedback paths, respectively, if frequency of output signal is to be either a fraction or a multiple of the frequency of the input signal. If no division is required, the ratios could be 1.

Figure 1:
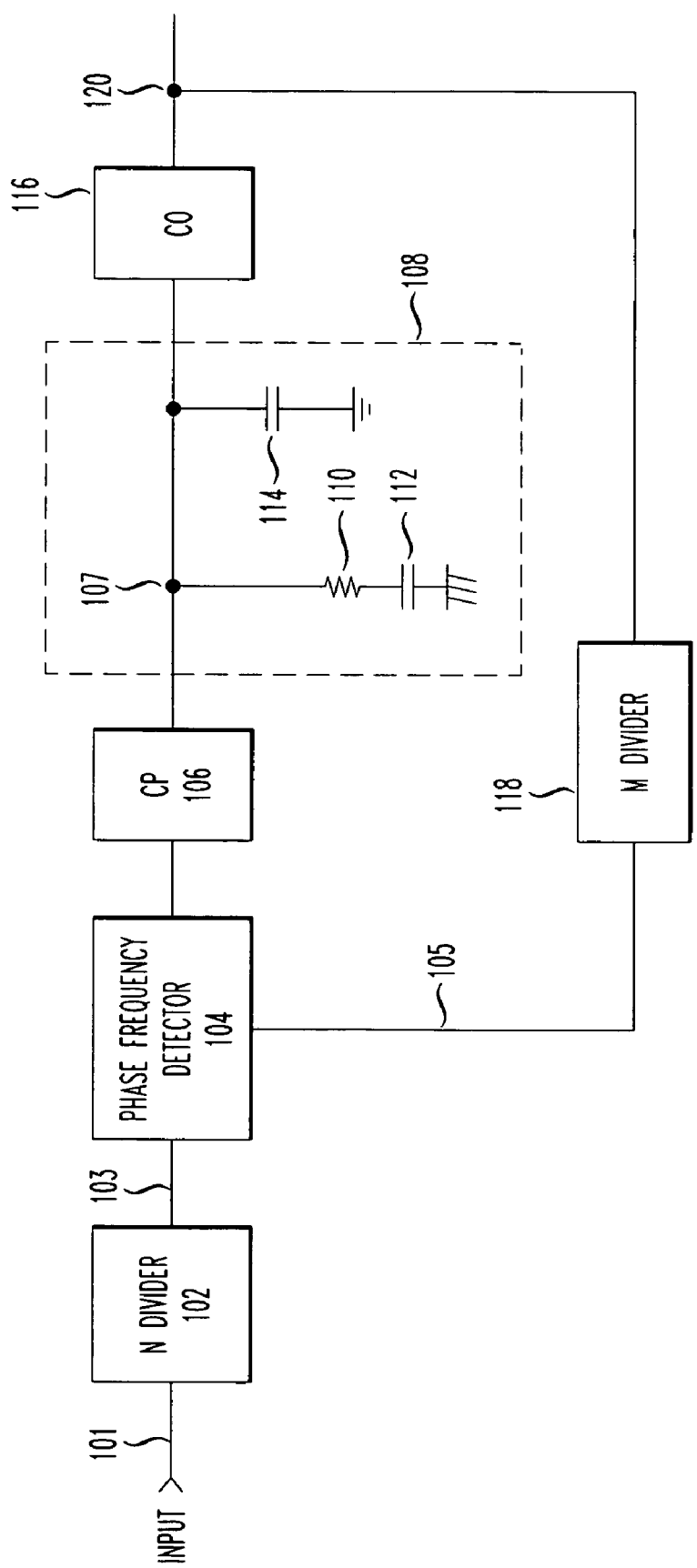
FIG. 1 is a schematic of a Phase Locked Loop (PLL)

FIG. 1 shows a PLL including a PFD 104, a CP 106, a loop filter 108, and a CO 116 connected in series. An N-divider 102 is coupled to an input of the PFD 104. An M-divider 118 is coupled to the output of the CO 116, and the output of M-divider 118 is coupled and fed back to another input of the PFD 104. An input signal 101 is fed into N divider 102, which divides input signal 101 by a factor of N to provide input reference signal 103. The N-divided input reference signal 103 is input to PFD 104. Output signal 120 of PLL 100 is supplied to M-divider 118, which divides output signal 120 by a factor of M to generate an input feedback signal 105.

PFD 104 compares the frequencies and phases of input reference signal 103 and feedback signal 105 generating a phase error signal to CP 106. The phase error signal is the difference in phase between what the phase of the output signal currently is (e.g., phase of feedback signal 105) and what the phase of the signal should be (e.g., phase of the input reference signal 101). The phase error signal is supplied to loop filter 108 in terms of a current value (e.g., charge stream) from CP 106. Loop filter 108 filters currents from CP 106 by passing some current signals at certain frequencies while attenuating other current signals at other frequencies and generates a control signal to tune the phase of the output signal 120 based on the difference between the actual control signal and a normal operating or optimum signal. The control signal is supplied to CO 116 to provide an output phase for output signal 120 that the loop will lock with the reference phase of input reference frequency 101.

The control voltage 107 is composed of two parts, the voltage across the resistor 110, which is the proportional component, and the voltage across the capacitor 112, which is the integral component of the loop filter voltage. Capacitor 114 is a small capacitor used to attenuate high-frequency signals from the charge pump, so they are not modulated into phase jitter by the CO 116. CO 116, in turn, generates output signal 120 having an output phase that the loop will lock with the reference phase of input reference frequency 101.

Figure 2:
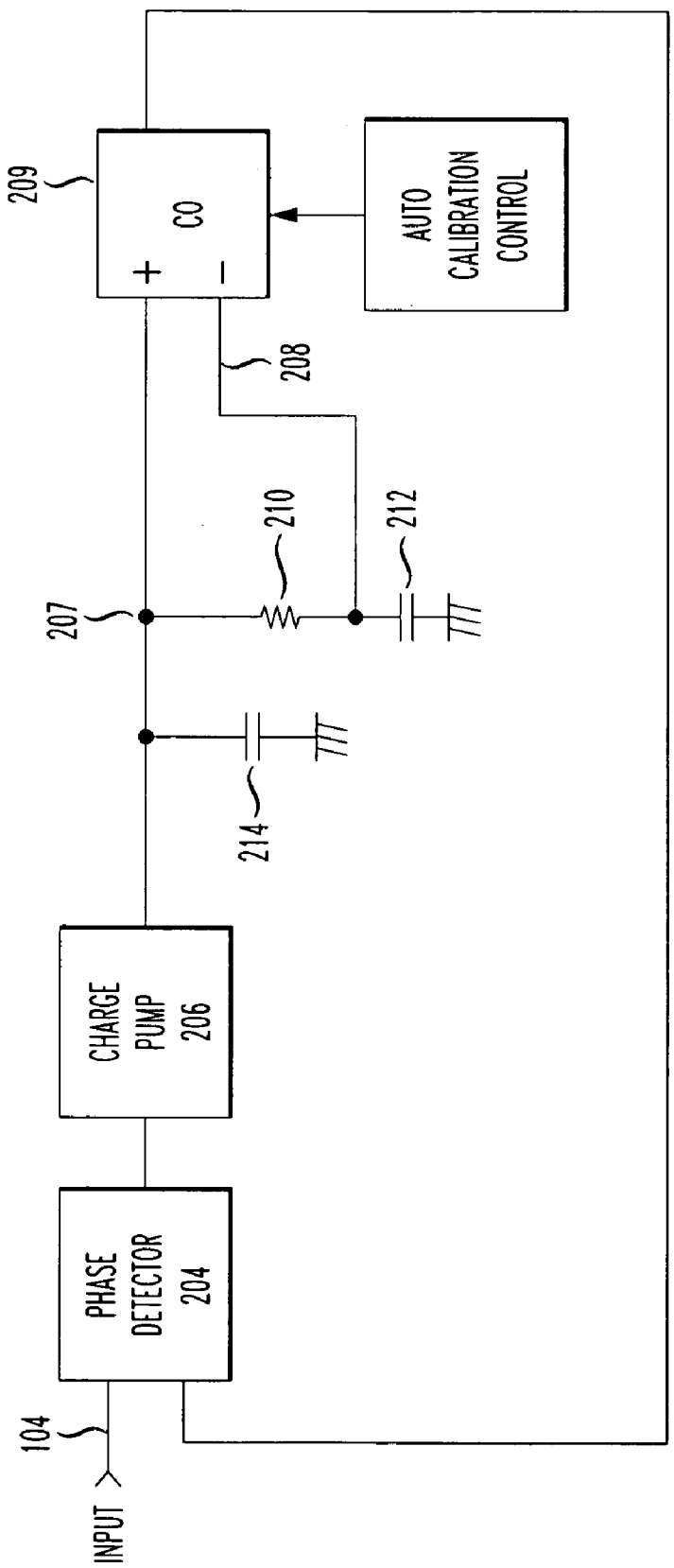
FIG. 2 is a schematic of a PLL in accordance with an embodiment of the disclosure herein showing a current mirror feed back loop.

FIG. 2 shows a block diagram of a PLL 200 designed in accordance with the principles disclosed herein. PLL 200 has a Phase/Frequency Detector (PFD) 204, a charge pump (CP) 206, a ripple bypass capacitor 214, a loop filter resistor 210 and loop filter capacitor 212. Filter control voltage 207 is the sum of the voltages across resistor 210 and capacitor 212. Capacitance of loop filter capacitor 212 is small compared to that of capacitor 112 (of FIG. 1). Voltage 208 taken from loop filter capacitor 212 is provided as an input to controlled oscillator (CO) 209.

Note that CO 209 receives three inputs. The first input is from an auto-calibration circuit 215, which is used to set a center frequency of CO 209. The second input is connected to control voltage 207, hereafter referred to as the nominal low-gain input. The third input (Voltage 208) is referred to as the inverted low-gain input, and has associated with it a small-signal gain ($K_{VCO}$), whose value is opposite in sign and lower in magnitude than the nominal low-gain input.

Figure 3:
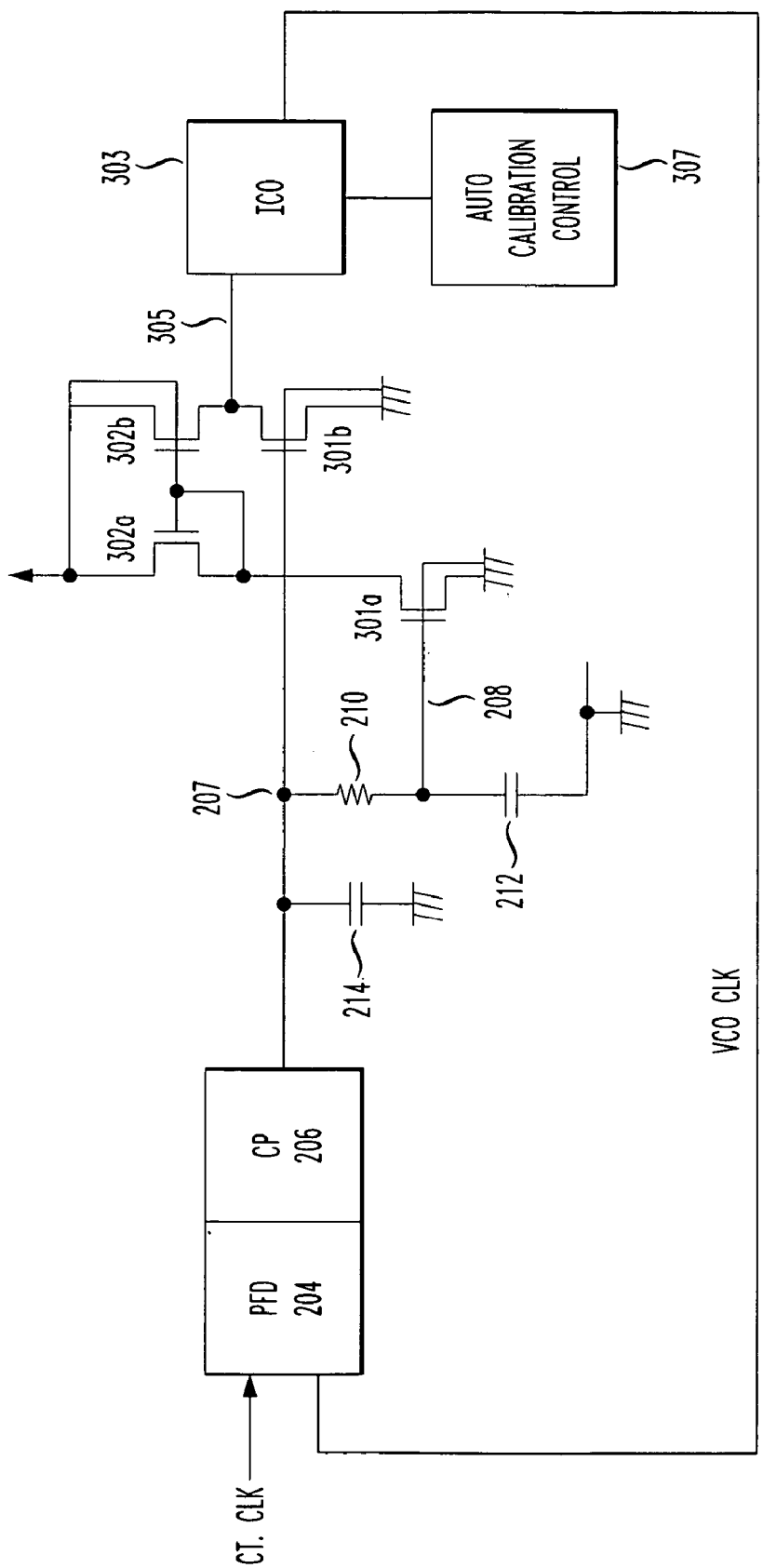
FIG. 3 shows another schematic of the PLL showing a detailed view of the current mirror of FIG. 2.

FIG. 3 shows a block diagram of an illustrative charge pump PLL configured to incorporate a current mirror with a scaling factor to reduce the size of integral (damping) capacitor 212. Using this circuit to implement an inverted low-gain input to CO 209 allows for capacitor 212 to be reduced in value without changing the loop dynamics from PLL 100 of FIG. 1, and allows for a more conventional two-input oscillator to be used. Matched transistors 301a and 301b convert filter voltages 207 and 208 into currents. Current from transistor 301a is subtracted from the current of transistor 301b by use of a current mirror with a gain less than 1 thereby ensuring that the current produced by transistor 301b is larger than that of transistor 302b. Current 305 is used as low gain input to the current-controlled oscillator (ICO) 303, whose high-gain input is controlled by an auto-calibration control loop 307. Note that the current mirror gain ($\alpha$) must be less than 1. The new current, produced by transistor 302b reduces the current input to the low-gain input to the ICO, thereby reducing its "integral component" and not the "proportional component." This reduced integral component produces an effect equivalent to scaling the damping capacitor 212 without increasing its size. Thus, the size of the damping capacitor 212 may be scaled down depending on the magnitude of the current produced at the current mirror 204 without altering loop dynamics of the PLL.

Figure 4:
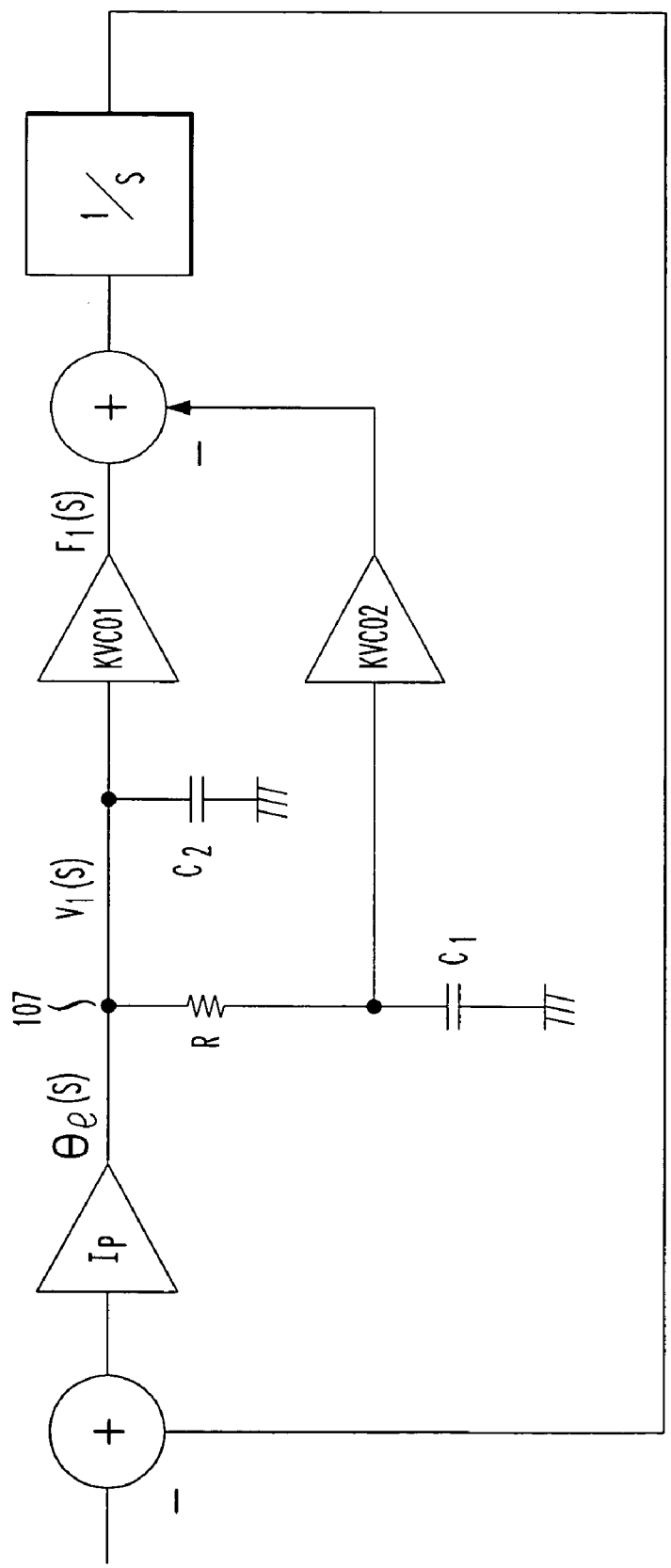
FIG. 4 is a small signal mathematical model of the disclosed principles.

FIG. 4 illustrates a mathematical small-signal model of the PLL shown in FIG. 3. The loop filter has a resistor R and a capacitor $C_1$ connected in series. A second capacitor $C_2$ is connected parallel to the RC low pass filter. The impedance of the filter $Z_S$ is therefore, $$Z(s) = \left(R + \frac{1}{sC_1}\right) \Big\| \left(\frac{1}{sC_2}\right) \qquad (1)$$

or equivalently, $$Z(s) = \left(\frac{1 + sRC_1}{sC_1(1 + sC_2)}\right) \qquad (1)$$

which gives the voltage $V_{1(S)}$ as $$V_1(s) = Ip\theta e(s)\left(\frac{1 + sRC_1}{sC_1(1 + sC_2)}\right) \qquad (2)$$

Referring further to FIG. 4, $$V_2(s) = \left(\frac{Ip\theta e(s)}{sC_1(1 + sRC_2)}\right) \qquad (3)$$

$$F_1(s) = \left(\frac{Kvco * Ip\theta e(s)(1 + sRC_1)}{sC_1(1 + sRC_2)}\right) \qquad (4)$$

and $$F_2(s) = \alpha\left(\frac{Kvco * Ip\theta e(s)}{sC_1(1 + sRC_2)}\right) \qquad (5)$$

From FIG. 4, we can see that $$F3(s) = F1(s) - F2(s) \qquad (6a)$$

or equivalently, $$F_3(s) = Kvco * Ip\theta e(s) * \left(\frac{(1 + sRC_1) - \alpha}{sC_1(1 + sRC_2)}\right) \qquad (6b)$$

Note that $F_{3(S)}$ may be understood as a combination of an integral and a proportional component:

$$F_3(s) = \left(\frac{Kvco * Ip\theta e(s)}{sC_1(1+sRC_2)}\right)[(1-\alpha)+sRC_1] \qquad (6c)$$

It has been observed that if $\alpha$ is selected to have a value between zero and 1, then the integral component $(1-\alpha)$, may be reduced without affecting the proportional component $(sRC_1)$. As a result, one can effectively increase the magnitude of the capacitor $C_1$. This allows for a reduction in area of $C_1$ while maintaining the same loop dynamics as before the modification.

Persons of ordinary skill in the art may make various changes in the details, materials, and arrangements of the parts illustrated herein without departing from the scope of the invention. All such modifications should be construed as properly within the scope of the appended claims.

What is claimed is:

1. An integrated circuit (IC) comprising:
   a Phase Locked Loop (PLL) comprising:
     a current-controlled oscillator (ICO);
     a loop filter, the loop filter comprising a loop filter resistor and a loop filter damping capacitor (C1); and
     a current scaling circuit, wherein the current scaling circuit produces a current which reduces the current input to a low-gain input to the ICO, thereby reducing integral component of loop filter voltage, wherein the scaling circuit is configured to increase effective capacitance of the loop filter damping capacitor.

2. The integrated circuit of claim 1 wherein the current scaling circuit comprises a current mirror.

3. The integrated circuit of claim 2 wherein the current mirror is configured to generate a current proportional to voltage drop across the loop filter damping capacitor.

4. The integrated circuit of claim 1 wherein the scaling circuit is configured to increase effective capacitance of the loop filter damping capacitor without influencing the PLL's loop dynamics.

5. A Phase Locked Loop (PLL) comprising:
   a current-controlled oscillator (ICO);
   a loop filter, the loop filter comprising a loop filter resistor and a loop filter damping capacitor (C1);
   a current scaling circuit, wherein the current scaling circuit produces a current which reduces the current input to a low-gain input to the ICO, thereby reducing integral component of loop filter voltages, wherein the scaling circuit is configured to increase effective capacitance of the loop filter damping capacitor.

6. The PLL of claim 5 wherein the current scaling circuit comprises a current mirror.

7. The PLL of claim 6 wherein the current mirror is configured to generate a current proportional to voltage drop across the loop filter damping capacitor.

8. The PLL of claim 5 wherein the scaling circuit is configured to increase effective capacitance of the loop filter damping capacitor without influencing the PLL's loop dynamics.

9. An integrated circuit (IC) comprising:
   a Phase Locked Loop (PLL) comprising:
     a current-controlled oscillator (ICO);
     a loop filter, the loop filter comprising a loop filter resistor and a loop filter damping capacitor (C1); and
     a current scaling circuit, wherein the current scaling circuit produces a current which reduces the current input to a low-gain input to the ICO, thereby reducing integral component of loop filter voltage, wherein the current scaling circuit comprises a current mirror.

10. The integrated circuit of claim 9 wherein the current mirror is configured to generate a current proportional to voltage drop across the loop filter damping capacitor.

11. The integrated circuit of claim 9 wherein the current mirror has a gain less than 1.

12. The integrated circuit of claim 9 wherein the current scaling circuit reduces the integral component of the loop filter voltage without changing a proportional component of the loop filter voltage.

13. The integrated circuit of claim 9 wherein the ICO is a two-input oscillator having the low-gain input and a high-gain input for setting a center frequency of the ICO.

14. The integrated circuit of claim 2 wherein the current mirror has a gain less than 1.

15. The integrated circuit of claim 1 wherein the current scaling circuit reduces the integral component of the loop filter voltage without changing a proportional component of the loop filter voltage.

16. The integrated circuit of claim 1 wherein the ICO is a two-input oscillator having the low-gain input and a high-gain input for setting a center frequency of the ICO.

17. The PLL of claim 6 wherein the current mirror has a gain less than 1.

18. The PLL of claim 5 wherein the current scaling circuit reduces the integral component of the loop filter voltage without changing a proportional component of the loop filter voltage.

19. The PLL of claim 5 wherein the ICO is a two-input oscillator having the low-gain input and a high-gain input for setting a center frequency of the ICO.

* * * * *